(12) United States Patent
Liskow

(10) Patent No.: US 9,121,497 B2
(45) Date of Patent: Sep. 1, 2015

(54) ATTACHMENT OF A CONTROL UNIT FOR A TRANSMISSION CONTROL MODULE TO A CARRIER BOARD

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 134 days.

(21) Appl. No.: 13/664,818

(22) Filed: Oct. 31, 2012

(65) Prior Publication Data

US 2013/0114224 A1    May 9, 2013

(30) Foreign Application Priority Data

Nov. 3, 2011    (DE) .......... 10 2011 085 650

(51) Int. Cl.
| | |
|---|---|
| *H05K 7/10* | (2006.01) |
| *H05K 7/12* | (2006.01) |
| *H05K 7/00* | (2006.01) |
| *F16H 61/00* | (2006.01) |
| *H05K 5/00* | (2006.01) |

(52) U.S. Cl.
CPC .......... *F16H 61/0006* (2013.01); *H05K 5/0082* (2013.01)

(58) Field of Classification Search
CPC .......... H02B 1/50; H02B 1/20; H01R 25/003; H01R 13/70; F03D 9/007; H05K 1/111; H05K 1/141; H05K 3/284; H05K 3/3447; H05K 3/3452
See application file for complete search history.

(56) References Cited

U.S. PATENT DOCUMENTS

| | | | | |
|---|---|---|---|---|
| 5,709,134 A | * | 1/1998 | Ulm .......................... | 74/606 R |
| 5,814,765 A | * | 9/1998 | Bauer et al. ................ | 174/50.54 |
| 5,940,279 A | * | 8/1999 | Gademann et al. .......... | 361/823 |
| 6,028,770 A | * | 2/2000 | Kerner et al. ................. | 361/704 |
| 6,522,528 B2 | * | 2/2003 | Yamane ........................ | 361/601 |
| 6,523,399 B2 | * | 2/2003 | Fritzsche et al. ........... | 73/115.02 |
| 6,724,627 B2 | * | 4/2004 | Onizuka et al. ............... | 361/704 |
| 6,805,146 B2 | * | 10/2004 | Albert et al. ................ | 137/15.18 |
| 6,894,891 B2 | * | 5/2005 | Darr et al. .................... | 361/601 |
| 6,924,985 B2 | * | 8/2005 | Kawakita et al. ............. | 361/715 |
| 7,059,214 B2 | * | 6/2006 | Murakami et al. .......... | 74/606 R |
| 7,073,410 B2 | * | 7/2006 | Albert ......................... | 74/606 R |
| 7,193,852 B2 | * | 3/2007 | Wetzel .......................... | 361/714 |
| 7,426,117 B2 | * | 9/2008 | Van Schuylenbergh et al. ............................. | 361/760 |
| 7,471,520 B2 | * | 12/2008 | Schwiebert et al. .......... | 361/760 |
| 7,518,882 B2 | * | 4/2009 | Shimizu et al. ............... | 361/775 |

(Continued)

FOREIGN PATENT DOCUMENTS

DE    196 00 619 A1    7/1997

*Primary Examiner* — Hoa C Nguyen
*Assistant Examiner* — Xanthia C Cunningham
(74) *Attorney, Agent, or Firm* — Maginot, Moore & Beck LLP

(57) ABSTRACT

A control unit for a transmission control module of a motor vehicle transmission includes a circuit mounting device and at least one attachment device configured to attach the circuit mounting device to a carrier board. The circuit mounting device includes an electronic circuit and has a first bearing side with which it is configured to be pressed against a second bearing side of the carrier board by the attachment device. The attachment device has at least one attachment element which is connected to the circuit mounting device and protrudes with a first end from the circuit mounting device on the first bearing side. The attachment element is configured to project through an attachment opening in the second bearing side of the carrier board.

9 Claims, 3 Drawing Sheets

(56) References Cited

U.S. PATENT DOCUMENTS

| | | | |
|---|---|---|---|
| 7,643,297 B2* | 1/2010 | Tominaga et al. | 361/704 |
| 7,760,497 B2* | 7/2010 | Eddy et al. | 361/688 |
| 8,067,840 B2* | 11/2011 | Bielen et al. | 257/777 |
| 8,068,346 B2* | 11/2011 | Maier et al. | 361/760 |
| 8,081,486 B2* | 12/2011 | Dorn | 361/776 |
| 8,107,208 B2* | 1/2012 | Hotchkiss et al. | 361/118 |
| 8,184,438 B2* | 5/2012 | Kaneko et al. | 361/705 |
| 8,199,463 B2* | 6/2012 | Lu et al. | 361/601 |
| 8,356,762 B2* | 1/2013 | Tomikawa et al. | 237/12.3 R |
| 8,619,434 B2* | 12/2013 | Biester et al. | 361/807 |
| 2002/0074979 A1* | 6/2002 | Onizuka et al. | 323/267 |
| 2003/0037828 A1* | 2/2003 | Gander et al. | 137/884 |
| 2003/0117776 A1* | 6/2003 | Katsuro et al. | 361/705 |
| 2005/0018410 A1* | 1/2005 | Brandenburg et al. | 361/782 |
| 2005/0190539 A1* | 9/2005 | Watanabe et al. | 361/704 |
| 2006/0077643 A1* | 4/2006 | Mayuzumi et al. | 361/753 |
| 2009/0262503 A1* | 10/2009 | Kaneko et al. | 361/706 |
| 2010/0065960 A1* | 3/2010 | Mino et al. | 257/693 |
| 2010/0118503 A1* | 5/2010 | Kellermann | 361/772 |
| 2010/0202110 A1* | 8/2010 | Becker et al. | 361/707 |
| 2011/0044005 A1* | 2/2011 | Wetzel et al. | 361/714 |
| 2012/0037403 A1* | 2/2012 | Liskow | 174/251 |

* cited by examiner

ATTACHMENT OF A CONTROL UNIT FOR A TRANSMISSION CONTROL MODULE TO A CARRIER BOARD

This application claims priority under 35 U.S.C. §119 to patent application no. DE 10 2011 085 650.1, filed on Nov. 3, 2011 in Germany, the disclosure of which is incorporated herein by reference in its entirety.

BACKGROUND

The present disclosure relates to a control unit for a transmission control module of a motor vehicle transmission having a circuit mounting device and at least one attachment device, wherein the circuit mounting device has an electronic circuit, and the attachment device is provided for attaching the circuit mounting device to a carrier board. The circuit mounting device has a first bearing side and can be pressed with the first bearing side against a second bearing side of a carrier board by means of the attachment device. The disclosure also relates to a transmission control module and to a transmission for a motor vehicle.

Transmission control modules are installed, for example, in the interior of transmissions, for example in automatic transmissions of motor vehicles. A transmission control module has in this context a control unit, various sensors, plugs, etc. During operation, the control unit generally heats up with the result that there is provision for heat to be conducted away. For this purpose, the control unit can bear against a heat-conducting board in order therefore to be able to conduct away heat. For example, the control unit can be pressed with a spring against a supporting board, wherein the spring can be attached to the supporting board and can be embodied as a spring clip. The spring can alternatively also be supported on a transmission component. Furthermore, the control unit can also be attached to a supporting board by means of a heat-conducting bonding agent. DE 196 00 619 A1 discloses, for example, a control unit in which a power component is pressed onto a printed circuit board by a spring element. However, it has become apparent that bonded connections of an oil-resistant design constitute a thermally conductive resistor and therefore cannot ensure optimum conducting away of heat. When there are spring clips, bending stress of the carrier board occurs, and when a spring is supported on a transmission face the pressing over a surface does not occur until the components are completely assembled. There is therefore a need to make available a way of attaching a control unit which is simpler and which ensures optimum conducting away of heat.

SUMMARY

The control unit can be attached directly to a carrier board with a control unit or a transmission control module and a transmission, wherein a sufficiently strong pressing force is ensured in order to permit a gap which is as small as possible, in particular an oil gap which is as small as possible, for a maximum transfer of heat. The pressing against the carrier board can occur here independently of further components, in particular independently of whether a corresponding transmission component is already present or not. A further advantage is that only a minimum installation space is used or necessary for the attachment according to the disclosure. Advantageous refinements of the control unit and/or of the transmission control module and of the transmission are defined in the dependent claims.

According to the disclosure, the attachment device has at least one attachment element which is connected to a circuit mounting device and protrudes with a first end from the circuit mounting device on the first bearing side and is designed to project through an attachment opening in a second bearing side of a carrier board. This permits a frictionally locking and positively locking connection of a control unit to a carrier board. The application of bending forces into the carrier board is avoided here since the attachment occurs directly in the region of the control unit or of the circuit mounting device. This permits, for example, direct metal contact without an insulating bonding layer and at the same time also the application of a significantly increased pressing force between the control unit and the carrier board. In the case of an oil gap which is as small as possible, more metallic contract area can be made available, which improves the transfer of heat.

The circuit mounting device can be at least partially surrounded with a sealing compound, wherein the at least one attachment element extends through the sealing compound and projects at least as far as the surface of the sealing compound, on the side facing away from the bearing side. As a result, a securing force for the attachment element can be applied in order to attach the attachment element on the other side, for example in the case of riveted connections. The sealing compound is also referred to as a mold, and the circuit which is at least partially encapsulated as a molded part.

According to the disclosure there is provision that with the attachment device a pressing force can be applied to the carrier board in the region of the bearing face, i.e. in the region of the bearing sides.

The attachment element can be, for example, an attachment bolt; for example, the at least one attachment element can have at the protruding end a thread for screwing on a nut in order to generate the pressing force. The attachment element can also be embodied as a tulip rivet at the protruding end. For example, the protruding end can also be embodied as a tumble rivet connection.

The carrier board can be attached to a transmission housing face in order to introduce the heat which is to be carried away into the transmission housing.

The attachment device can be embodied in one piece with the circuit mounting device.

The circuit mounting device can have a circuit carrier and a baseplate, wherein the circuit is arranged on the circuit carrier, and wherein the clamping force can be introduced into the baseplate via the attachment device. For example, the attachment device can be embodied in one piece with the baseplate.

The circuit carrier can have, in the region of the attachment device, a cutout with a clear opening cross section for accommodating the attachment device, wherein the attachment device has a securing region which has a larger outer cross section than the clear cross section of the receptacle opening. For this purpose, the receptacle opening can have, for example, an edge cross section with an undercut, for example with a dovetail-shaped cross section.

To bring about reliable securement, two or more attachment elements may be provided which ensure a uniform contact pressure over the entire surface.

According to the disclosure, a transmission control module is provided which has a carrier board, a control unit and a multiplicity of electro technical components from the group of sensors, plugs and connections etc. The control unit is connected to at least some of the components, wherein the control unit and at least some of the components are attached to the carrier board.

The carrier board can have an attachment opening which is formed with a cross section which tapers at least partially toward the control unit.

According to the disclosure, a transmission for a motor vehicle is provided which has a transmission device, a transmission housing and a transmission control module according to the disclosure. The carrier board is attached to an inner side of a wall of the transmission housing in order to ensure that heat is conducted away as well as possible.

Possible refinements and advantages of the disclosure proposed here are described partially with reference to control units according to the disclosure and partially with reference to transmission control modules according to the disclosure and partially also with reference to transmissions according to the disclosure for a motor vehicle. A person skilled in the art will recognize that the individual features can be combined with one another in any desired fashion and can also be transferred from the control unit to the transmission control module, or the transmission, or else vice versa, in order to be able to achieve synergy effects in this way.

BRIEF DESCRIPTION OF THE DRAWINGS

Embodiments of the disclosure are explained further below with reference to the appended drawings, wherein neither the drawings nor the description are to be interpreted as restricting the disclosure.

The figures are merely illustrated schematically and not true to scale. Identical reference symbols denote identical or identically acting components.

DETAILED DESCRIPTION

Figure 1:
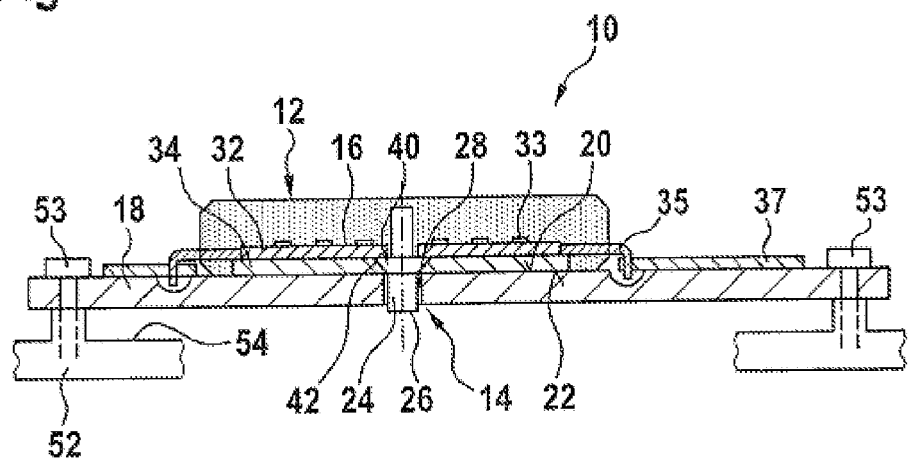
FIG. 1 shows a cross section through an exemplary embodiment of a control unit according to the present disclosure.

FIG. 1 shows a control unit 10 for a transmission control module of a motor vehicle transmission. The control unit 10 has a circuit mounting device 12 and at least one attachment device 14. The circuit mounting device 12 has an electronic circuit 16. The attachment device 14 is provided for attaching the circuit mounting device 12 to a carrier board 18. The circuit mounting device has a first bearing side 20 and can be pressed with the first bearing side 20 against a second bearing side 22 of the carrier board by means of the attachment device 14. According to the disclosure there is provision that the attachment device 14 has at least one attachment element 24 which is connected to the circuit mounting device 12 and protrudes with a first end 26 from the circuit mounting device 12 on the first bearing side 20. The attachment element is designed to project through an attachment opening 28 in the second bearing side 22 of the carrier board 18.

Figure 2:
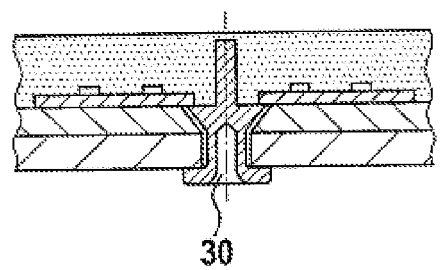
FIG. 2 shows a detail of the control unit from FIG. 1 with the attachment having taken place.

The protruding end 26 is embodied, for example, as a tulip rivet 30, with respect to which the attachment element 24 is shown in section in FIG. 2. As is apparent, in FIG. 1 the tulip rivet 30 is inserted only into the attachment opening 28 in such a way that the tulip rivet 30 projects on the lower side in the drawing. Subsequently, the end which protrudes or projects out of the board may be flared with a shaping punching tool, so that the circuit mounting device 12 is subsequently connected to the carrier board 18 in a positively locking fashion.

Figure 3:
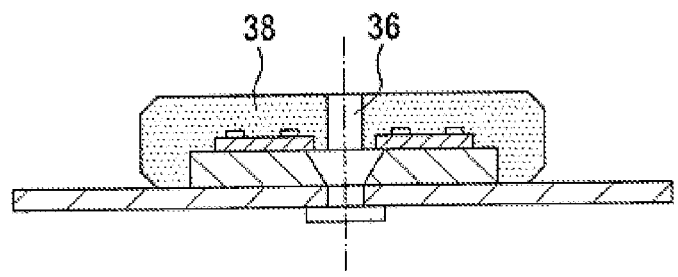
FIG. 3 shows a further exemplary embodiment of a control unit according to the disclosure.

The circuit mounting device 12 can have a circuit carrier 32 and a baseplate 34, wherein the clamping force can be introduced into the baseplate via the attachment device. For example a circuit 33, which is connected to further switching elements 37 via contacts 35, is arranged on the circuit carrier. The circuit carrier 32 has a cutout 36, for example in the region of the attachment device, and the at least one attachment element 24 projects through the cutout 36, as illustrated in FIGS. 1 to 3.

At this point it is to be noted that the features which are described separately above can also be provided independently of the other features which are respectively illustrated and described in the figures.

The circuit mounting device 12 can preferably be at least partially surrounded with a sealing compound 38. The at least one attachment element 24 can extend through the sealing compound and project as far as the surface of the sealing compound on that side which faces away from the bearing side. For example, the attachment element 24 can extend to just below the surface, as is shown in FIGS. 1 and 2, or else directly as far as the surface itself, as is shown in FIG. 3, with the result that the attachment element 24 is visible there. The provision of the attachment element with an elongated region in the vicinity of the sealing compound provides a possible way of applying an opposing securing force during the shaping of the attachment, in particular in the case of a rivet connection. As a result, the sealing compound is itself protected and therefore does not have to be configured for the application of an opposing securing force.

The circuit mounting device, for example the baseplate 34, can have a receptacle opening 42 with a clear opening cross section for receiving the attachment device. The attachment device has a securing region which has a larger outer cross section than the clear cross section of the receptacle opening. For example, the attachment element is embodied with a conical region 40 which tapers in the direction of the protruding first end 26, with the result that said region 40 is secured in the conical edge region of receptacle opening 42 which is embodied as an opposing piece, in order to introduce the clamping force into the baseplate 34.

Figure 4:
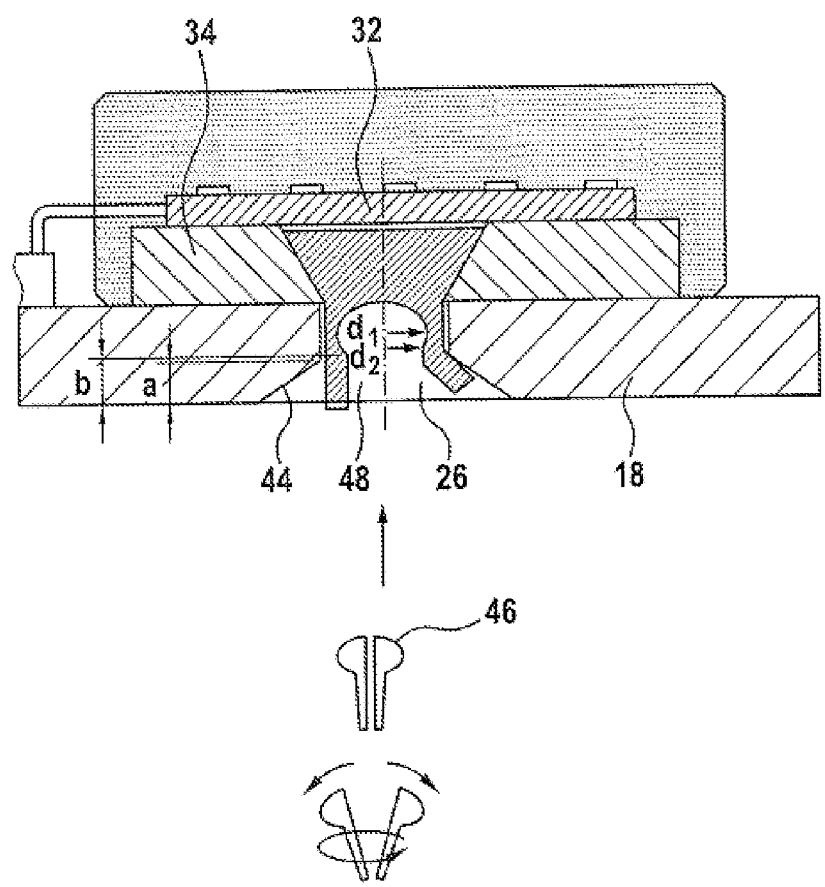
FIG. 4 shows a further exemplary embodiment of a control unit according to the disclosure.

According to the exemplary embodiment shown in FIG. 4, the attachment element 24 does not project beyond the baseplate 34 but instead has a dovetail-shaped cross section with which the pressing force can be introduced into the baseplate 34. The circuit carrier 32 can then be embodied in a corresponding continuous fashion. The attachment element 24 projects into the opening in the carrier board 18 which is formed with a cross section 44 which widens outwardly. The protruding first end 26 of the attachment element 24 has relatively thin edge regions which, after the insertion of the attachment element, can be shaped in such a way that they bear against the conical faces 44 and result in a positively locking connection. For this purpose, a tool 46 is introduced into an opening 48 and the edges are bent by means of a tumbling movement. During the tumbling movement, it is possible to provide radial spreading of the tool head in order to apply the attachment bolt which is embodied as a hollow rivet, to the hole contour of the carrier board by shaping. FIG. 4 also shows a first internal diameter d1 and a second internal diameter d2. These merge with one another in as flowing and harmonic a fashion as possible in order to ensure that as few stresses as possible occur in the material, and in particular no notching effects. Furthermore it is possible to provide that a first material length b is greater than a second material length a, and the first diameter d1 is greater than the second diameter d2. This results, during the attachment, in the control unit 10 being attracted to the carrier board 18, with the result that the control unit 10 does not have to be pressed on from above. The shaping tool acts in a drawing fashion on the plane with the dimension b in the axial direction. The diameter jump in the attachment hole in the carrier board takes place on the plane with the dimension a. FIG. 4 shows the edge in the plugged-in state on the left and in the bent-over state on the right of the positively locking connection.

As is merely indicated in FIG. 1, but also applies to the other exemplary embodiments, the control unit 10 is part of a transmission control module 50 which comprises both the control unit and the carrier board 18. Furthermore, a plurality of electrotechnical components from the group of sensors, plugs and connections is provided, but these are not shown in more detail. The control unit 10 is connected to at least some of the components. The control unit 10 and at least some of the components are attached to the carrier board 18, which is not illustrated either.

Furthermore, FIG. 1 indicates a part of a transmission housing 52 which has an inner side 54. The transmission control module 50 is attached to the carrier board 18 on the inner side 54 of the wall of the transmission housing 52, for example with a screw connection 53 which is indicated. The transmission housing 52 is part of a transmission for a motor vehicle which has the transmission control module 50, the transmission housing 52 and a transmission device (not shown in more detail). The arrangement of the transmission control module 50 on the inner side serves to conduct away heat from the control unit 10 via the carrier board 18 to the transmission housing 52.

The baseplate 34 can be embodied as an integrated injection-molded metal floor which acts as a means of stabilizing the circuit carrier 32, and maybe, for example, an iTCU, an iTCU, or a re-molded iTCU, or TCU (Transmission Control Unit—electronic transmission controller).

Figure 5:
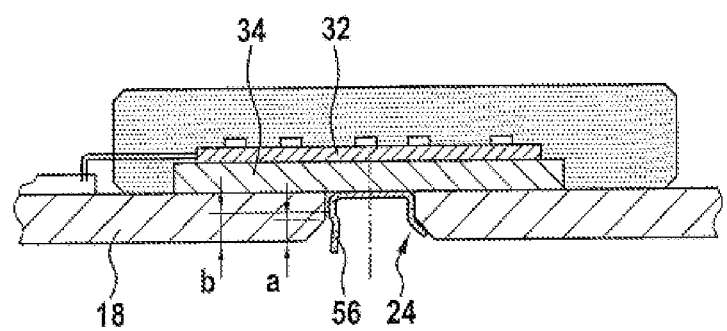
FIG. 5 shows a further exemplary embodiment of a control unit according to the disclosure.

FIG. 5 shows a further exemplary embodiment in which a continuous baseplate 34 with a circuit carrier 32 which is arranged thereon is provided. The attachment element 24 is connected to the baseplate on the underside of the baseplate 34. The attachment element 24 projects into the opening, which widens outwardly, in the carrier plate 18, with the result that the control unit can be attached to the carrier board 18 by bending of protruding edges 56. FIG. 5 illustrates the left-hand edge in the state in which it has not yet been bent over, i.e. beforehand, and the right-hand edge in the state in which it has already been bent over, i.e. afterwards.

What is claimed is:

1. A control unit for a transmission control module of a motor vehicle transmission, comprising:
    a circuit mounting device having an electronic circuit and defining a first bearing side;
    a carrier board defining a second bearing side; and
    at least one attachment device configured to attach the circuit mounting device to the carrier board, and having at least one attachment element,
    wherein the first bearing side of the circuit mounting device is pressed against the second bearing side of the carrier board by the attachment device,
    wherein the at least one attachment element is connected to the circuit mounting device and protrudes from the circuit mounting device on the first bearing side and projects through an attachment opening in the second bearing side of the carrier board, and
    wherein the circuit mounting device has a circuit carrier and a baseplate, wherein the circuit is arranged on the circuit carrier, and wherein the attachment device is configured to introduce a clamping force into the baseplate to press the first bearing side of the circuit mounting device against the second bearing side of the carrier board.

2. The control unit according to claim 1, wherein the circuit mounting device is at least partially surrounded with a sealing compound, and wherein the at least one attachment element extends through the sealing compound and projects at least as far as the surface of the sealing compound on the side facing away from the first bearing side.

3. The control unit according to claim 1, wherein the attachment device applies a pressing force to the carrier board in the region of the second bearing side.

4. The control unit according to claim 1, wherein the attachment device is embodied in one piece with the circuit mounting device.

5. The control unit according to claim 1, wherein the circuit carrier defines a cutout in the region of the attachment device, and wherein the at least one attachment element projects through the cutout.

6. The control unit according to claim 1, wherein the circuit mounting device defines a receptacle opening with a clear opening cross section configured to accommodate the attachment device, and wherein the attachment device has a securing region which has a larger cross section than the clear cross section of the receptacle opening.

7. The control unit according to claim 1, wherein two or more attachment elements are provided.

8. A transmission control module, comprising:
    a carrier board defining a second bearing side;
    a control unit including:
        a circuit mounting device having an electronic circuit and defining a first bearing side, wherein the circuit mounting device has a circuit carrier and a baseplate with the electronic circuit arranged on the circuit carrier, and
        at least one attachment device configured to attach the circuit mounting device to the carrier board,
        wherein the first bearing side of the circuit mounting device is pressed against the second bearing side of the carrier board by the attachment device, and
        wherein the at least one attachment element is connected to the circuit mounting device and protrudes from the circuit mounting device on the first bearing side and projects through an attachment opening in the second bearing side of the carrier board and wherein the attachment device is configured to introduce a clamping force into the baseplate and includes at least one attachment element to press the first bearing side of the circuit mounting device against the second bearing side of the carrier board, and
    a multiplicity of electrotechnical components from the group of sensors, plugs, and connections,
    wherein the control unit is connected to at least some of the components, and
    wherein the control unit and at least some of the components are attached to the carrier board.

9. A transmission for a motor vehicle, comprising:
    a transmission device;
    a transmission housing; and
    a transmission control module including:
        a carrier board defining a second bearing side,
        a control unit including:
            a circuit mounting device having an electronic circuit and defining a first bearing side, wherein the circuit mounting device has a circuit carrier and a baseplate with the electronic circuit arranged on the circuit carrier, and at least one attachment device configured to attach the circuit mounting device to the carrier board, wherein the first bearing side of the circuit mounting device is pressed against the second bearing side of the carrier board by the attachment device, wherein the attachment device is configured to introduce a clamping force into the baseplate and has at least one attachment element, and wherein the at least one attachment element is connected to the circuit mounting device and protrudes from the circuit mounting device on the first bearing side and projects through an attachment opening in the second bearing side of the carrier board, and a multiplicity of electrotechnical components from the group of sensors, plugs, and connections, wherein the control unit is connected to at least some of the components, and wherein the control unit and at least some of the components are attached to the carrier board, wherein the carrier board is attached to an inner side of a wall of the transmission housing.

* * * * *